(12) United States Patent
Funaoka et al.

(10) Patent No.: US 7,282,636 B2
(45) Date of Patent: Oct. 16, 2007

(54) APPLICATION OF LIGNIN DERIVATIVES TO PHOTOELECTRIC TRANSDUCER AND PHOTOELECTROCHEMICAL CELL

(75) Inventors: Masamitsu Funaoka, Mie (JP); Mitsuru Aoyagi, Mie (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 0 days.

(21) Appl. No.: 11/199,211

(22) Filed: Aug. 9, 2005

(65) Prior Publication Data

US 2006/0035392 A1    Feb. 16, 2006

Related U.S. Application Data

(63) Continuation of application No. PCT/JP2004/001336, filed on Feb. 9, 2004.

(30) Foreign Application Priority Data

Feb. 10, 2003    (JP)    ............................... 2003-032891

(51) Int. Cl.
    *H01L 31/00*    (2006.01)
(52) U.S. Cl. ...................... 136/263; 136/252; 136/256; 438/82
(58) Field of Classification Search ................ 136/263, 136/256, 250; 257/431, 436, 40; 438/82, 438/98, 63; 530/502; 524/72
See application file for complete search history.

(56) References Cited

U.S. PATENT DOCUMENTS

| 4,218,528 | A  | * | 8/1980  | Shimada et al. ............ | 430/76 |
| 6,632,931 | B1 | * | 10/2003 | Funaoka ...................... | 530/502 |
| 6,841,660 | B1 | * | 1/2005  | Funaoka ...................... | 530/502 |
| 2005/0154194 | A1 | * | 7/2005 | Funaoka ...................... | 530/502 |

FOREIGN PATENT DOCUMENTS

| EP | 1022283 A1 | * | 7/2000 |
| JP | A 02-233701 |   | 9/1990 |
| JP | A 09-278904 |   | 10/1997 |
| JP | A 2001-034233 |   | 2/2001 |
| JP | A 2001-064494 |   | 3/2001 |
| JP | A 2001-131201 |   | 5/2001 |
| JP | A 2001-261839 |   | 9/2001 |
| JP | A 2002-105240 |   | 4/2002 |
| WO | WO 99/14223 A1 |   | 3/1999 |

* cited by examiner

OTHER PUBLICATIONS

Hara et al., "A Coumarin-Derivative Dye Sensitized Nanocrystalline $TiO_2$ Solar Cell Having a High Solar-Energy Conversion Efficiency Up to 5.6%," *The Royal Society of Chemistry*, Chem. Commun. pp. 569-570, {2001}.

*Primary Examiner*—Nam Nguyen
*Assistant Examiner*—Jeffrey Barton
(74) *Attorney, Agent, or Firm*—Oliff & Berridge, PLC

(57) ABSTRACT

The invention regards application of lignin derivatives to a photoelectric transducer. The photoelectric transducer of the invention includes a semiconductor film as a thin film electrode, that is photosensitized by one or multiple lignin derivatives selected from the group consisting of: (a) a lignophenol derivative or a phenol derivative of lignin that is prepared by solvating a lignin-containing material with a phenol compound and adding an acid to the solvate; (b) a secondary derivative that is prepared by one reaction of the lignophenol derivative (a) selected among acylation, carboxylation, amidation, introduction of a crosslinking group, and alkali treatment; (c) a higher-order derivative that is prepared by at least two reactions of the lignophenol derivative (a) selected among acylation, carboxylation, amidation, introduction of the crosslinking group, and alkali treatment; (d) a crosslinked secondary derivative that is prepared by crosslinking the secondary derivative (b) obtained by the introduction of the crosslinking group; and (e) a crosslinked higher-order derivative that is prepared by crosslinking the higher-order derivative (c) obtained by the introduction of the crosslinking group.

12 Claims, 6 Drawing Sheets

Ortho-Position
Binding Unit

Para-Position
Binding Unit

US 7,282,636 B2

APPLICATION OF LIGNIN DERIVATIVES TO PHOTOELECTRIC TRANSDUCER AND PHOTOELECTROCHEMICAL CELL

CROSS-REFERENCE TO RELATED APPLICATIONS

This is a continuation application of international Application No. PCT/JP2004/001336, filed on Feb. 9, 2004.

BACKGROUND OF THE INVENTION

1. Field of the Invention

The present invention relates to application of lignin derivatives obtained by reactions of phenol compounds with lignin. More specifically the invention pertains to application of lignin derivatives to a semiconductor thin film electrode, to a photoelectric transducer, and to a solar cell.

2. Description of the Related Art

Solar cells are widely used as photoelectric cells for photoelectric energy conversion. The most common structure of the solar cell has the pn junction in the vicinity of the surface of a semiconductor crystal (for example, silicon) or amorphous plate. The electric current runs in an external circuit from the p-type semiconductor to the n-type semiconductor by radiation of visible rays. Such solar cells consume large energy and chemicals, such as harmful heavy metals, for their production. These solar cells accordingly have the energy and environment-related problems, as well as the rather high manufacturing cost.

Dye-sensitized solar cells have recently drawn attention, because of their less environmental load, lower manufacturing cost, and high energy conversion efficiency. Gratzel et al. developed an electrode of a porous titanium oxide thin film sensitized with ruthenium-bipyridine-dicarboxylate to attain the photoelectric conversion efficiency of 10.0%. Ruthenium complexes, other noble metal complexes, chlorophyll derivatives, and zinc porphyrin complexes have been proposed as the excitation center of these dye-sensitized solar cells.

Ruthenium and other noble metals as the excitation center are, however, subject to resource limitation. The materials of synthesizing the dye ligands are mainly derived from the oil resources and other chemical resources and are thus expected to have future resource constraints.

There are solar cells sensitized with only organic material, in addition to the conventional silicon solar cells and the organic metal complex-sensitized solar cells. One example of the proposed prganic material-sensitized or organic dye-sensitized solar cells includes an oxide semiconductor electrode sensitized by coumarin dye (see Chem. Commun., 2001, 6, 569-570). This organic dye-sensitized solar cell has the high photoelectric conversion efficiency of 6.0%. The organic dye-sensitized solar cells have advantages of the performances, the environmental load, and the manufacturing cost. Like the other proposed solar cells, however, the materials of synthesizing the organic dyes are also derived from the oil resources and other chemical resources and are thus expected to have further resource constraints.

SUMMARY OF THE INVENTION

An object of the invention is thus to provide a semiconductor thin film electrode, a photoelectric transducer, and a solar cell that are free from the future resource constraints.

The inventors of the present application have focused the study on lignin included in wood resource-derived lignocellulose and have completed the present invention, based on the finding that application of a lignin derivative obtained by a reaction of lignin with a phenol compound to the semiconductor thin film electrode gives the photoelectric conversion property.

The present invention is directed to a photoelectric transducer including a semiconductor film that is photosensitized by one or multiple lignin derivative selected from the group consisting of: (a) a lignophenol derivative or a phenol derivative of lignin that is prepared by solvating a lignin-containing material with a phenol compound and adding an acid to the solvate; (b) a secondary derivative that is prepared by one reaction of the lignophenol derivative (a) selected among acylation, carboxylation, amidation, introduction of a crosslinking group, and alkali treatment; (c) a higher-order derivative that is prepared by at least two reactions of the lignophenol derivative (a) selected among acylation, carboxylation, amidation, introduction of the crosslinking group, and alkali treatment; (d) a crosslinked secondary derivative that is prepared by crosslinking the secondary derivative (b) obtained by the introduction of the crosslinking group; and (e) a crosslinked higher-order derivative that is prepared by crosslinking the higher-order derivative (c) obtained by the introduction of the crosslinking group.

In the photoelectric transducer of the invention, the semiconductor particles are preferably photosensitized by the lignophenol derivative. The phenol compound is preferably one or a combination selected from the group consisting of p-cresol, 2,6-dimethylphenol, 2,4-dimehylphenol, 2-methoxyphenol, 2,6-dimethoxyphenol, catechol, resorcinol, 4-methylcatechol, pyrogallol, and phloroglucinol. Among these, more preferable example is p-cresol. The semiconductor film preferably includes one or multiple materials selected among organic and inorganic materials, in addition to the lignin derivative.

In the photoelectric transducer of the invention, the lignin derivative is preferably exposed to one or multiple energy irradiations selected among heat, light, and radiation. The semiconductor film preferably includes a lignocellulose-derived organic material containing cellulose, lignin, and polyphenol materials or a derivative of the organic material, in addition to the lignin derivative.

The present invention is also directed to a photoelectrochemical cell including any of the photoelectric transducer described above.

The present invention is also directed to a semiconductor particle photosensitized by one or multiple lignin derivatives selected from the group consisting of: (a) a lignophenol derivative or a phenol derivative of lignin that is prepared by solvating a lignin-containing material with a phenol compound and adding an acid to the solvate; (b) a secondary derivative that is prepared by one reaction of the lignophenol derivative (a) selected among acylation, carboxylation, amidation, introduction of a crosslinking group, and alkali treatment; (c) a higher-order derivative that is prepared by at least two reactions of the lignophenol derivative (a) selected among acylation, carboxylation, amidation, introduction of the crosslinking group, and alkali treatment; (d) a crosslinked secondary derivative that is prepared by crosslinking the secondary derivative (b) obtained by the introduction of the crosslinking group; and (e) a crosslinked higher-order derivative that is prepared by crosslinking the higher-order derivative (c) obtained by the introduction of the crosslinking group.

The present invention is further directed to a manufacturing method of a photoelectric transducer. The manufacturing method includes one or multiple production steps selected from the group consisting of production steps (a) through (e) to prepare one or multiple lignin derivatives; and a manufacturing step of a semiconductor film with the one or multiple lignin derivatives prepared in the one or multiple production steps. The production steps (a) through (e) are: (a) preparing a lignophenol derivative or a phenol derivative of lignin by solvating a lignin-containing material with a phenol compound and adding an acid to the solvate; (b) preparing a secondary derivative by one reaction of the lignophenol derivative (a) selected among acylation, carboxylation, amidation, introduction of a crosslinking group, and alkali treatment; (c) preparing a higher-order derivative by at least two reactions of the lignophenol derivative (a) selected among acylation, carboxylation, amidation, introduction of the crosslinking group, and alkali treatment; (d) preparing a crosslinked secondary derivative by crosslinking the secondary derivative (b) obtained by the introduction of the crosslinking group; and (e) preparing a crosslinked higher-order derivative by crosslinking the higher-order derivative (c) obtained by the introduction of the crosslinking group.

The present invention is further directed to a photosensitizer including one or multiple lignin derivatives selected from the group consisting of: (a) a lignophenol derivative or a phenol derivative of lignin that is prepared by solvating a lignin-containing material with a phenol compound and adding an acid to the solvate; (b) a secondary derivative that is prepared by one reaction of the lignophenol derivative (a) selected among acylation, carboxylation, amidation, introduction of a crosslinking group, and alkali treatment; (c) a higher-order derivative that is prepared by at least two reactions of the lignophenol derivative (a) selected among acylation, carboxylation, amidation, introduction of the crosslinking group, and alkali treatment; (d) a crosslinked secondary derivative that is prepared by crosslinking the secondary derivative (b) obtained by the introduction of the crosslinking group; and (e) a crosslinked higher-order derivative that is prepared by crosslinking the higher-order derivative (c) obtained by the introduction of the crosslinking group.

The photoelectric transducer and the photoelectrochemical cell of the invention include the semiconductor film photosensitized with the lignin derivative, which is derived from the continuously recyclable lignin-containing wood resources, and are accordingly free from the restrictions of exhausting oil resources and other fossil resources. Such new application of the wood resources desirably accelerates recycle of the wood resources.

DESCRIPTION OF THE PREFERRED EMBODIMENT

Figure 1:
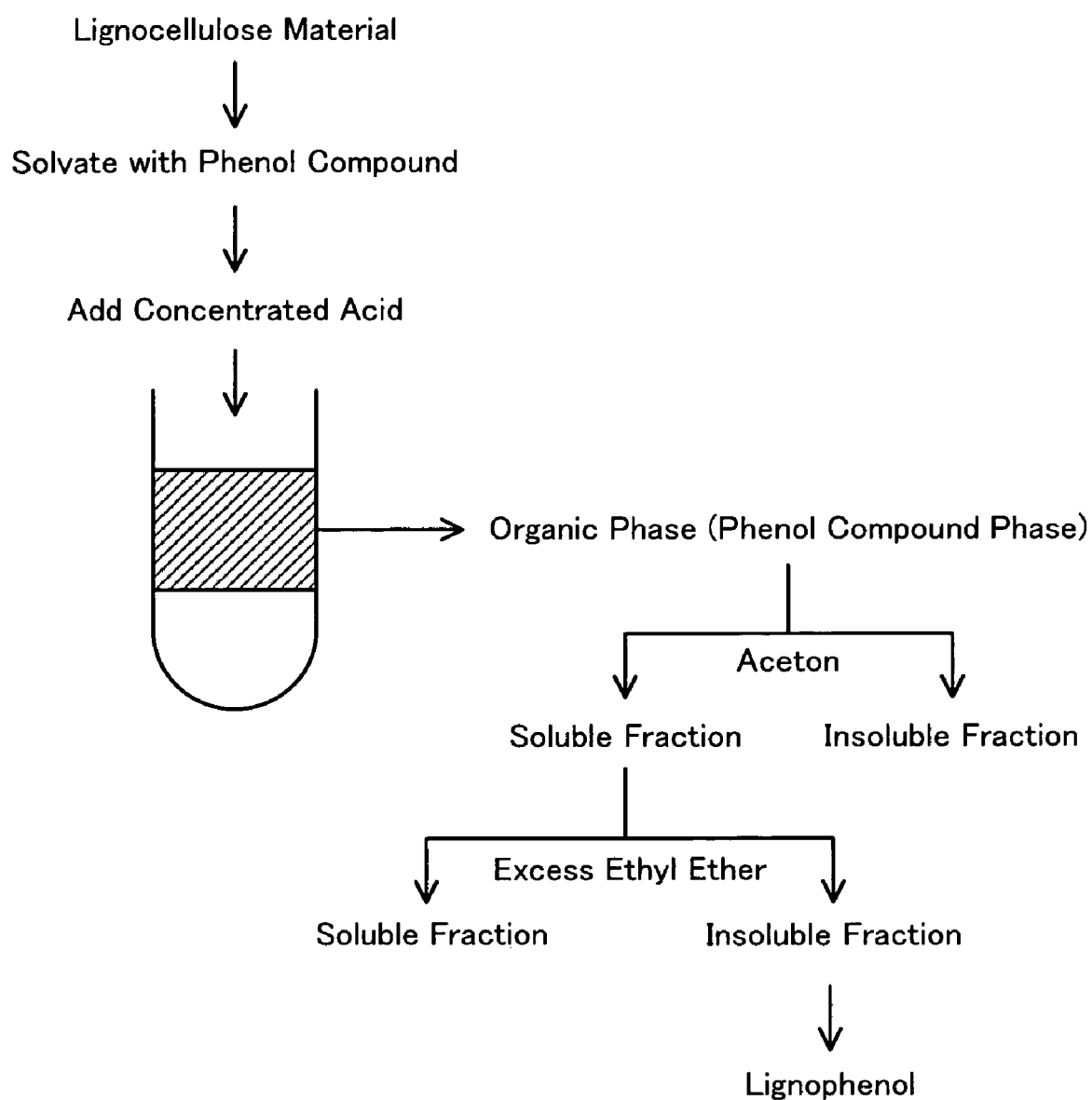
FIG. 1 shows an example of manufacturing process of a lignophenol derivative.

The photoelectric transducer and the photoelectrochemical cell of the invention include a semiconductor thin film electrode photosensitized by a lignin derivative that is produced from a forest resource-derived, lignin-containing material.

The semiconductor thin film electrode, the photoelectric transducer, and the photoelectrochemical cell of the invention are described in this sequence.

The semiconductor thin film electrode of the invention includes a semiconductor layer photosensitized by a selected lignin derivative.

(Lignin Derivative)

The lignin derivative of the invention is one or multiple lignin derivative selected from the group consisting of: (a) a lignophenol derivative or a phenol derivative of lignin that is prepared by solvating a lignin-containing material with a phenol compound and adding an acid to the solvate; (b) a secondary derivative that is prepared by one reaction of the lignophenol derivative (a) selected among acylation, carboxylation, amidation, introduction of a crosslinking group, and alkali treatment; (c) a higher-order derivative that is prepared by at least two reactions of the lignophenol derivative (a) selected among acylation, carboxylation, amidation, introduction of the crosslinking group, and alkali treatment; (d) a crosslinked secondary derivative that is prepared by crosslinking the secondary derivative (b) obtained by the introduction of the crosslinking group; and (e) a crosslinked higher-order derivative that is prepared by crosslinking the higher-order derivative (c) obtained by the introduction of the crosslinking group.

(Lignophenol Derivative)

The lignophenol derivative or a phenol derivative of lignin is one of the lignin derivatives of the invention and is prepared by solvating a lignin-containing material with a phenol compound and adding an acid to the solvate. This reaction process gives a lignin derivative including the phenol compound grafted (introduced) at a benzyl position (C1 position in a side chain, hereafter simply referred to as the C1 position) of the aryl propane unit of lignin. The grafted phenol compound has a bond of a carbon atom at an ortho position or a para position relative to its phenol hydroxyl group to the carbon atom at the C1 position of the aryl propane unit of lignin. The binding forms a 1,1-bis(aryl) propane unit in lignin. This grafting reaction selectively introduces the phenol compound at the C1 position and thereby releases diverse bindings at the C1 position of the lignin-containing starting material. This reduces the diversity of the lignin matrix and decreases the molecular weight. As is known in the art, the resulting lignophenol derivative has the solubilities in various solvents, thermal mobility, and thermal plasticity, which are not observed in lignin.

Various methods may be applied to solvate the lignin-containing material with a phenol compound. One available method soaks the lignin-containing material with a liquid phenol compound. Another available method mixes the lignin-containing material with a liquid or solid phenol compound dissolved in a solvent and removes the solvent for phenol compound sorption of the lignin-containing material.

The inventors of the present invention have developed a separation method that combines structural destruction by swelling of a hydrocarbon with a concentrated acid with solvation of lignin with a phenol compound to separate a lignocellulose material into the hydrocarbon and a lignophenol derivative while controlling inactivation of lignin (see Japanese Patent Laid-Open Gazette No. H02-233701). The lignophenol derivative thus obtained may be applied to a molding compound, such as cellulose fibers, to give a molded object (see Japanese Patent Laid-Open Gazette No. H09-278904). It has also been reported that this lignophenol derivative is a lignin polymer of plurality of 1,1-bis(aryl) propane unit and has potentially high binding capability (see Japanese Patent Laid-Open Gazette No. H09-278904).

The inventors of the present invention have also found that methylolation of the lignophenol derivative gives the crosslinking ability and constructs a linear or networked crosslinking structure and that alkali treatment changes the molecular structure to the lower-molecular lignophenol derivative to be soluble in a solvent (see Japanese Patent Laid-Open Gazette No. 2001-261839).

The general description of lignophenol derivatives and their manufacturing processes is found in International Publication WO99/14223, Japanese Patent Laid-Open Gazettes No. 2001-64494, No. 2001-261839, No. 2001-131201, No. 2001-34233, and No. 2002-105240 (the contents of these patent documents are hereby incorporated by reference into this application) FIG. 1 shows an example of manufacturing process of a lignophenol derivative from a lignocellulose material.

Figure 2:
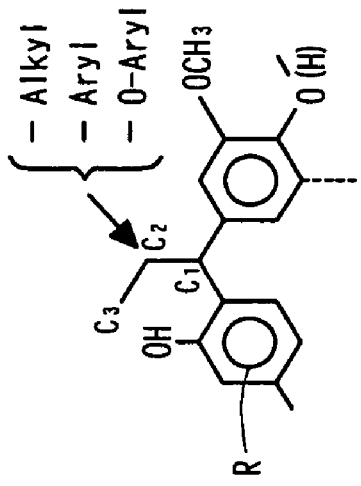
FIG. 2 shows structural conversion of natural lignin having the aryl propane unit in a phase separation system with a phenol compound, for example, p-cresol, to give a lignophenol derivative.
Figure 2:
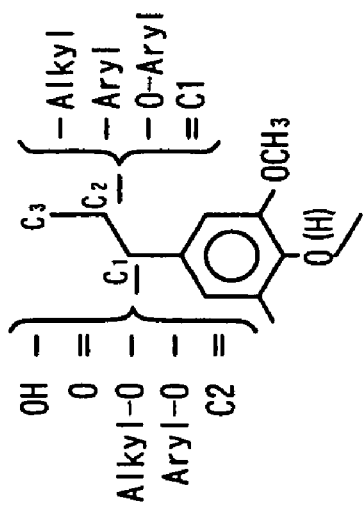
Figure 2:
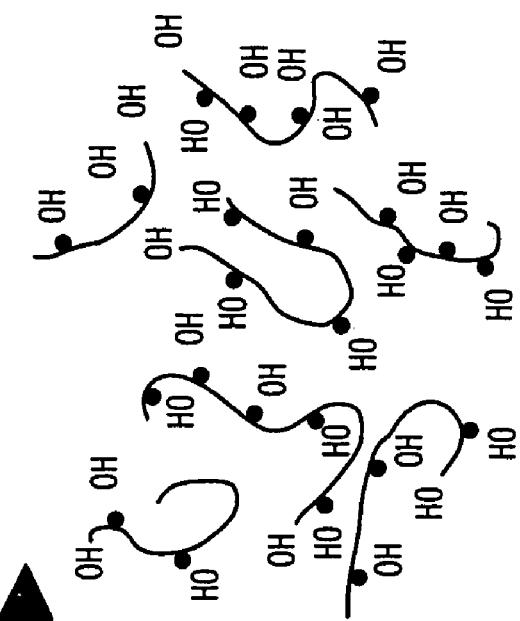
Figure 2:
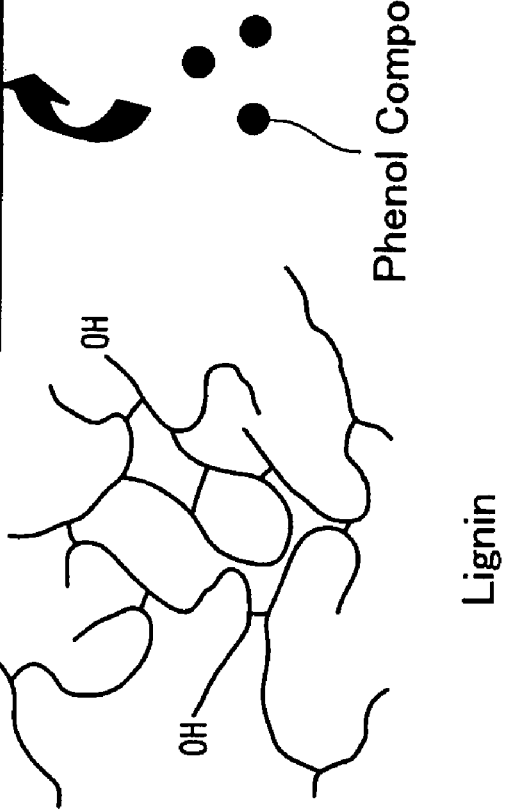

The structural conversion process of FIG. 1 exposes a lignocellulose material solvated with a phenol compound to an acid to release the composite state of the aryl propane unit of natural lignin and simultaneously to graft the phenol compound selectively at the C1 position (benzyl position) of the aryl propane unit of natural lignin. This reaction produces a lignophenol derivative simultaneously with separation from cellulose. One example of the structural conversion in this manufacturing process is shown in FIG. 2.

The lignophenol derivative is a lignin-derived polymer mixture obtained by reaction and separation of a lignin-containing material, for example, a lignocellulose material. The content of the grafted phenol compound in the polymer mixture and the molecular weight of the resulting polymer mixture depend upon the lignin structure of the lignin-containing starting material and the reaction conditions.

(Lignin-Containing Material)

An example of the lignin-containing material of the invention is a lignocellulose material containing natural lignin. The lignocellulose material may be any of various wood materials including wood flours and chips, as well as agricultural wastes and industrial wastes of wood resources including wood wastes, mill ends, and waste paper. The wood materials may be composed of any of broadleaf trees, conifer trees, various plants, as well as agricultural wastes and industrial wastes of such trees and plants.

The lignin-containing material of the invention is not restricted to such natural lignin-containing materials but may be black liquor obtained by pulping the lignocellulose material.

(Phenol Compound)

The phenol compound of the invention may be any of monovalent, divalent, and trivalent phenol compounds.

Examples of the monovalent phenol compound include phenol with or without one or more substituents, naphthol with or without one or more substituents, anthrol with or without one or more substituents, and anthraquinol with or without one or more substituents.

Examples of the divalent phenol compound include catechol with or without one or more substituents, resorcinol with or without one or more substituents, and hydroquinone with or without one or more substituents.

An example of the trivalent phenol compound is pyrogallol with or without one or more substituents.

The phenol compound of the invention is one or a mixture of multiple phenol compounds selected among the monovalent, divalent, and trivalent phenol compounds. The monovalent phenol compounds are especially preferable.

The monovalent, divalent, and trivalent phenol compounds may have any substituents but preferably those other than electron-withdrawing groups like halogen atoms; for example, lower alkyl group-containing substituents of 1 to 4 or more preferably 1 to 3 carbon atoms, aryl groups (for example, phenyl group) and other aromatic substituents, and hydroxyl group-containing substituents. The lower alkyl group-containing substituents include lower alkyl groups (for example, methyl group, ethyl group, and propyl group) and lower alkoxy groups (for example, methoxy group, ethoxy group, and propoxy group).

Binding of a carbon atom at an ortho position or at a para position relative to the phenol hydroxyl group of the phenol compound to a carbon atom at the C1 position of the aryl propane unit of lignin forms the 1,1-bis(aryl) propane unit. At least one of the ortho positions and the para position relative to the phenol hydroxyl group preferably has no substituent to ensure at least one introduction site in the phenol compound.

Figure 3:
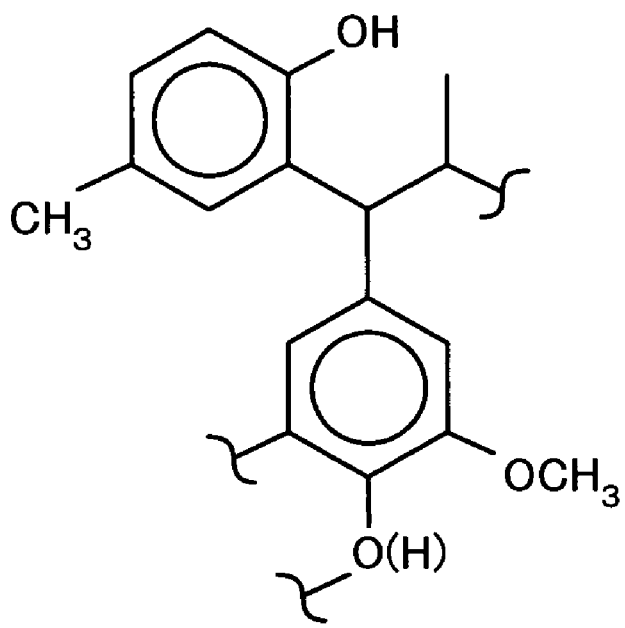
FIG. 3 shows an ortho-position binding unit and a para-position binding unit formed with phenol compounds.
Figure 3:
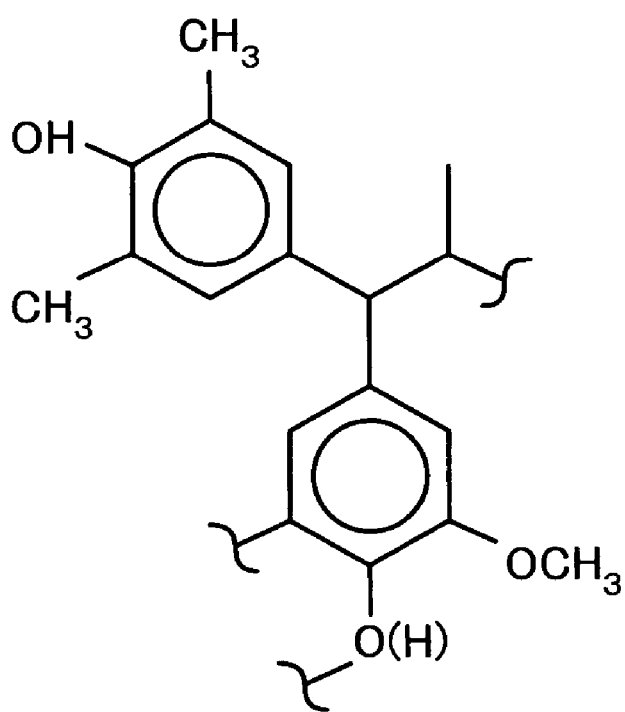

Binding of a carbon atom at an ortho position relative to the phenol hydroxyl group of the phenol compound to a carbon atom at the C1 position of the aryl propane unit of lignin forms an ortho-position binding unit. Similarly binding of a carbon atom at the para position relative to the phenol hydroxyl group of the phenol compound to a carbon atom at the C1 position forms a para-position binding unit. FIG. 3 shows one example of the ortho-position binding unit and the para-position binding unit formed with p-cresol and 2,6-dimethylphenol respectively as phenol compounds.

The phenol compound of the invention may be one or multiple phenol derivative selected among non-substituted phenol derivatives and various substituted phenol derivatives with at least one non-substituted ortho position or a non-substituted para position.

The ortho-position binding unit and the para-position binding unit exert different functions in, for example, a subsequent alkali treatment process. The ortho-position binding unit under gentle alkali treatment eliminates the phenol hydroxyl group of the grafted phenol compound and produces an aryl coumaran structure. The ortho-position binding unit under severe alkali treatment has a change of the molecular structure accompanied with a shift of the aryl group. The ortho-position binding unit under alkali treatment thus contributes to efficient degradation to the lower-molecular lignophenol derivative.

The para-position binding unit under alkali treatment does not produce the aryl coumaran structure or have a change of the molecular structure. The para-position binding unit thus does not contribute to degradation to the lower-molecular lignophenol derivative but gives the alkali resistance.

Adequate selection of the phenol compound for preparation of the lignophenol derivative regulates the introduction of the crosslinking group in a subsequent reaction to prepare a secondary derivative from the lignophenol derivative and accordingly controls the crosslinking reactivity of the resulting secondary derivative as a prepolymer.

The crosslinking group may be introduced at the ortho positions and the para position relative to the phenol hydroxyl group as described later. The binding positions of the phenol compound to the phenyl propane unit of lignin are also the ortho positions and the para position relative to the phenol hydroxyl group. Introduction of substituents at the ortho positions and the para position (3 positions at the maximum) relative to the phenol hydroxyl group regulates the sites and the number of the crosslinking groups introduced into the phenol compound and accordingly controls the introduction of the crosslinking groups to lignin. Table 1 shows the substituents of the phenol compound in relation to the binding positions of the phenol compound to the phenyl propane unit of lignin and the introduction sites of a crosslinking group.

positions and with a substituted para position (for example, 4-substituted monovalent phenol compounds). One or a combination of 4-substituted phenol compounds and 2,4-substituted phenol compounds may thus be used preferably for preparation of the lignophenol derivative having the ortho-position binding unit.

Phenol compounds with a non-substituted para position (for example, 2-substituted and 6-substituted monovalent phenol compounds) are used for preparation of the lignophenol derivative having the para-position binding unit. Preferably used for the same purpose are phenol compounds with a non-substituted para position and with at least one substituted ortho position (preferably with all substituted ortho positions) (for example, 2,6-substituted monovalent phenol compounds). One or a combination of 2-substituted phenol compounds, 6-substituted phenol compounds, and 2,6-substituted phenol compounds may thus be used pref-

TABLE 1

| Substituent of Phenol Compound | Binding Position to Phenyl Propane Unit of Lignin | Introductions Site of Crosslinking group in Phenol Compound | Forming Ability of Ortho-Position Binding Unit | Forming Ability of Para-Position Binding Unit | Crosslinking Structure of Prepolymer |
|---|---|---|---|---|---|
| No substituent | Ortho Position (2- or 6-Position) or Para Position (4-Position) | Yes (2 or More) | Yes (in the case of binding at ortho position to lignin) | Yes (in the case of binding at para position to lignin) | Network |
| Mono-substituted | | | | | |
| 2- or 6- Substituted | Ortho Position (2- or 6-Position) | Yes (1: Para Position) | Yes | No | Network |
| | 4-Position (Para Position) | Yes (1: Ortho Position) | No | Yes | Network |
| 4- Substituted | Ortho Position (2- or 6-Position) | Yes (1: Ortho Position) | Yes | No | Network |
| Di-substituted | | | | | |
| 2,4- Substituted | 6-Position Ortho Position) | No | Yes | No | Linear |
| 2,6- Substituted | 4-Position (Para Position) | No | No | Yes | Linear |

Ortho-Position Binding Unit 1,1-bis(aryl) propane unit having a bond of a carbon atom at an ortho position relative to the phenol hydroxyl group of the phenol compound to a carbon atom at the C1 position in the side chain of the phenyl propane unit of lignin
Para-Position Binding Unit 1,1-bis(aryl) propane unit having a bond of a carbon atom at a para position relative to the phenol hydroxyl group of the phenol compound to a carbon atom at the C1 position in the side chain of the phenyl propane unit of lignin One or a combination of multiple phenol compounds may be selected adequately for introduction into lignin among phenol compounds with no introduction site of the crosslinking group, with one of different introduction sites, and with multiple introduction sites of different reactivities. This desirably regulates the introduction sites and the number of the crosslinking groups in a subsequent step and thereby controls the crosslinking density of a resulting crosslinked polymer.

Phenol compounds with at least one non-substituted ortho position (preferably with all non-substituted ortho positions) are used for preparation of the lignophenol derivative having the ortho-position binding unit. Preferably used for the same purpose are phenol compounds with at least one non-substituted ortho position (2-position or 6-position) and with a substituted para position (4-position) (for example, 2,4-substituted monovalent phenol compounds). More preferable are phenol compounds with all non-substituted ortho erably for preparation of the lignophenol derivative having the para-position binding unit.

Desirable examples of the phenol compound include p-cresol, 2,6-dimethylphenol (2,6-xylenol), 2,4-dimethylphenol (2,4-xylenol), 2-methoxyphenol (guaiacol), 2,6-dimethoxyphenol, catechol, resorcinol, 4-methylcatechol, pyrogallol, and phloroglucinol. Especially preferable is p-cresol for the high introduction efficiency.

(Acid)

The lignin-containing material may be exposed to any of various inorganic acids and organic acids to produce the lignophenol derivative. Examples of the inorganic acid include sulfuric acid, phosphoric acid, and hydrochloric acid, and examples of the organic acid include p-toluenesulfonic acid, trifluoroacetic acid, trichloroacetic acid, and formic acid. The acid preferably has the function of sufficiently swelling cellulose when a lignocellulose material is used for the lignin-containing material of the invention. The available acids having this function include sulfuric acid of not lower than 65% by weight (more specifically sulfuric acid of not lower than 72% by weight), phosphoric acid of not lower than 85% by weight, hydrochloric acid of not lower than 38% by weight, p-toluenesulfonic acid, trifluoroacetic acid, trichloroacetic acid, and formic acid. Especially preferable are phosphoric acid of not lower than 85% by weight (more specifically phosphoric acid of not lower than 95% by weight), trifluoroacetic acid, and formic acid.

Any of diverse methods may be applied to convert lignin included in the lignin-containing material into a lignophenol derivative and to separate the lignophenol derivative.

One method shown in FIG. 1 soaks the lignocellulose material (lignin-containing material) with a liquid phenol compound (for example, p-cresol) for solvation of lignin with the phenol compound and adds an acid (for example, 72% by weight of sulfuric acid) to dissolve the cellulose component of the solvated lignocellulose material. This produces a lignophenol derivative with the phenol compound grafted at the C1 position of the basic structural unit in a phenol compound phase, simultaneously with dissolution to the lower-molecular lignin. The lignophenol derivative is then extracted from the phenol compound phase. The lignophenol derivative is an assembly of lower-molecular lignin obtained by cleavage of the benzyl aryl ether linkage of lignin.

In the illustrated example of FIG. 2, the phase separation of natural lignin having the aryl propane unit gives the lignophenol derivative of the invention.

The lignophenol derivative may be extracted from the phenol compound phase by any of adequate methods. One available method mixes the phenol compound phase with a large excess of ethyl ether for sedimentation and dissolves the collected sediment fraction in acetone. The method then removes an acetone-insoluble fraction by centrifugation, concentrates a remaining acetone-soluble fraction, and adds the concentrated acetone-soluble fraction in drops to a large excess of ethyl ether for sedimentation. Removal of the solvent from the collected sediment fraction gives the lignophenol derivative. The crude lignophenol derivative may be obtained by simple vacuum distillation of the phenol compound phase or the acetone-soluble fraction.

Another method of preparing the lignophenol derivative soaks the lignin-containing material with a solid or liquid phenol compound dissolved in a solvent (for example, ethanol or acetone) and removes the solvent (sorption of the phenol compound). The obtained lignophenol derivative is extracted and separated with a liquid phenol compound. Still another method mixes a reaction mixture of the lignin-containing material and a phenol compound with a large excess of water, collects an insoluble fraction by centrifugation, and dries the collected insoluble fraction after deacidification. The lignophenol derivative may be extracted by addition of acetone or an alcohol to the dried substance. The acetone- or alcohol-soluble fraction of the dried substance may otherwise be added in drops to a large excess of ethyl ether. This gives the lignophenol derivative as an insoluble fraction. These methods of preparing the lignophenol derivative are only illustrative and not restrictive in any sense, and may be modified, changed, or altered according to the requirements.

The general properties, characteristics, and features of the lignophenol derivative of the invention obtained from the lignocellulose material are given below, although the lignophenol derivative of the invention is not restricted to such properties, characteristics, or features:

(1) has a weight-average molecular weight in a range of approximately 2000 to 20000;

(2) has substantially no conjugates in the molecular structure and an extremely light color, typically pale pink white powder;

(3) has a solid-liquid phase transition temperature of approximately 170° C. for conifer tree derivation and approximately 130° C. for broadleaf tree derivation; and (4) is readily soluble in methanol, ethanol, acetone, dioxane, pyridine, tetrahydrofuran, and dimethylformamide.

As is known in the art, the phenol compound is grafted at the C1 position via its phenol hydroxyl group in the lignophenol derivative. The resulting lignophenol derivative generally has some remain of the original aryl propane unit without graft of the phenol compound.

(Secondary Derivative)

The lignin derivative of the invention may be a secondary derivative obtained by chemical modification of the lignophenol derivative.

The secondary derivative is prepared by one reaction of the lignophenol derivative selected among acylation, carboxylation, amidation, introduction of a crosslinking group, and alkali treatment.

The acylation introduces the acyl group (RCO—) into the hydroxyl group of the lignophenol derivative and accordingly makes the acyl group bond to the oxygen atom of the phenol hydroxyl group to form the —O—COR group on the aromatic ring. Examples of the acyl group to be introduced include acetyl group, propionyl group, butyryl group, valeryl group, benzoyl group, toluoyl group. Especially preferable is the acetyl group. Exposure of the lignophenol derivative to an acylating agent, such as acetic anhydride, introduces the acyl group into the hydroxyl group, so as to protect the hydroxyl group. The protection of the hydroxyl group controls the hydroxyl group-based characteristics and may interfere with hydrogen bonding to lower the potential for association. General acylation conditions are applicable to the acylation of the lignophenol derivative. Carboxyl monohalides, such as acetyl chloride, may also be used for acylation.

The carboxylation uses an acid dihalide (or higher-order halide), an acid dichloride to introduce the carboxyl group (—COOH) simultaneously with esterification of the phenol hydroxyl group. Preferable examples of the acid dichloride are adipic dichloride, maleic dichloride, and terephthalic dichloride. The esterification with an acid halide is known in the art and is thus not specifically described here. General esterification conditions are applicable to the carboxylation of the lignophenol derivative.

The amidation introduces the amide group (—CONHR) into the hydroxyl group of the lignophenol derivative, where R denotes any of lower linear alkyl groups and lower branched alkyl groups of 1 to 5 carbon atoms, and cycloalkyl groups, alkyl aryl groups, and aralkyl groups of 6 to 9 carbon atoms with or without substituents. The amide group is introduced to the double bond in the lignophenol derivative or to the carboxyl group after carboxylation. Diversity of known amidation conditions and agents are applicable to the amidation of the lignophenol derivative.

The introduction of the crosslinking group exposes the lignophenol derivative to a crosslinking group-forming agent under an alkali condition to introduce the crosslinking group in at least one of ortho positions and a para position relative to the phenol hydroxyl group in the lignophenol derivative.

The reaction of the lignophenol derivative with the crosslinking group-forming agent gives the secondary derivative in the dissociation condition of the phenol hydroxyl group of the lignophenol derivative. Application of an adequate alkali solution attains the dissociation condition of the phenol hydroxyl group of the lignophenol derivative. The alkali and the solvent used and the concentration of the alkali solution are not specifically restricted, as long as the alkali solution can dissociate the phenol hydroxyl group. One example is a 0.1 N sodium hydroxide solution.

The crosslinking group is introducible to the ortho positions and the para position relative to the phenol hydroxyl group in this dissociation condition. The selection of one or a combination of multiple phenol compounds roughly determines the introduction position of the crosslinking group. The phenol compound with two substituents at both the ortho position and the para position does not allow the crosslinking group to be introduced to the grafted phenol nucleus but introduces the crosslinking group into the phenolic aromatic nucleus of the lignin structure. The phenolic aromatic nucleus of the lignin structure is mainly present at the polymer ends of the lignophenol derivative. A resulting prepolymer accordingly has the crosslinking group introduced at the polymer ends.

The phenol compound with only one substituent at the ortho position or at the para position or with no substituent allows the crosslinking group to be introduced to both the grafted phenol nucleus and the phenolic aromatic nucleus of the lignin structure. Introduction of the crosslinking group over the length of the polymer chain as well as the polymer ends gives a multifunctional prepolymer.

The crosslinking group introduced to the lignophenol derivative is not specifically restricted but any group introducible to the phenolic aromatic nucleus of the lignin structure or to the grafted phenol nucleus (aromatic nucleus of the grafted phenol compound). Examples of the crosslinking group include hydroxymethyl group, hydroxyethyl group, hydroxypropyl group, and 1-hydroxyvalerylaldehyde. The crosslinking group-forming agent is a nucleophilic compound and forms or keeps crosslinking groups after the reaction with the lignophenol derivative. Available examples of the crosslinking group-forming agent are formaldehyde, acetaldehyde, propionaldehyde, and glutaraldehyde. Formaldehyde is especially preferable for the high introduction efficiency.

For efficient introduction of the crosslinking group, the crosslinking group-forming agent to be added to the lignophenol derivative is at least 1 molar equivalent, preferably at least 10 molar equivalent, or more preferably at least 20 molar equivalent of the aromatic nucleus of the aryl propane unit of the lignin structure and/or the grafted phenol nucleus.

The alkali solution containing the mixture of the lignophenol derivative and the crosslinking group-forming agent may be heated according to the requirements to accelerate introduction of the crosslinking group into the aromatic nucleus). The heating condition for the accelerated introduction of the crosslinking group is not specifically restricted but is preferably in a temperature range of 40 to 100° C. The temperature of lower than 40° C. undesirably gives the extremely low reactivity of the crosslinking group-forming agent, whereas the temperature of higher than 100° C. undesirably activates the self reaction of the crosslinking group-forming agent and the side reactions other than the introduction of the crosslinking group in to the lignophenol derivative. The heating condition is preferably in a range of 50 to 80° C. and more specifically about 60° C. The introduction of the crosslinking group is stopped, for example, by cooling down the reaction solution. The reaction solution is acidified to pH of about 2, for example, with hydrochloric acid of an appropriate concentration. After the acidification, the acid and the unreacted crosslinking group-forming agent are removed by washing and dialysis of the reaction product. The reaction product is freeze dried after the dialysis and may be dried on phosphorus pentoxide under reduced pressure when appropriate.

The crosslinking secondary derivative thus obtained has the crosslinking group in at least one of the ortho positions and the para position relative to the phenol hydroxyl group in the lignophenol derivative.

The weight-average molecular weight of the resulting secondary derivative is generally in a range of 2000 to 20000 or more specifically in a range of 2000 to 10000, although these values are not restrictive. The crosslinking group introduced into the lignophenol derivative is generally 0.01 to 1.5 moles/C9 unit.

(Alkali Treatment)

Figure 4:
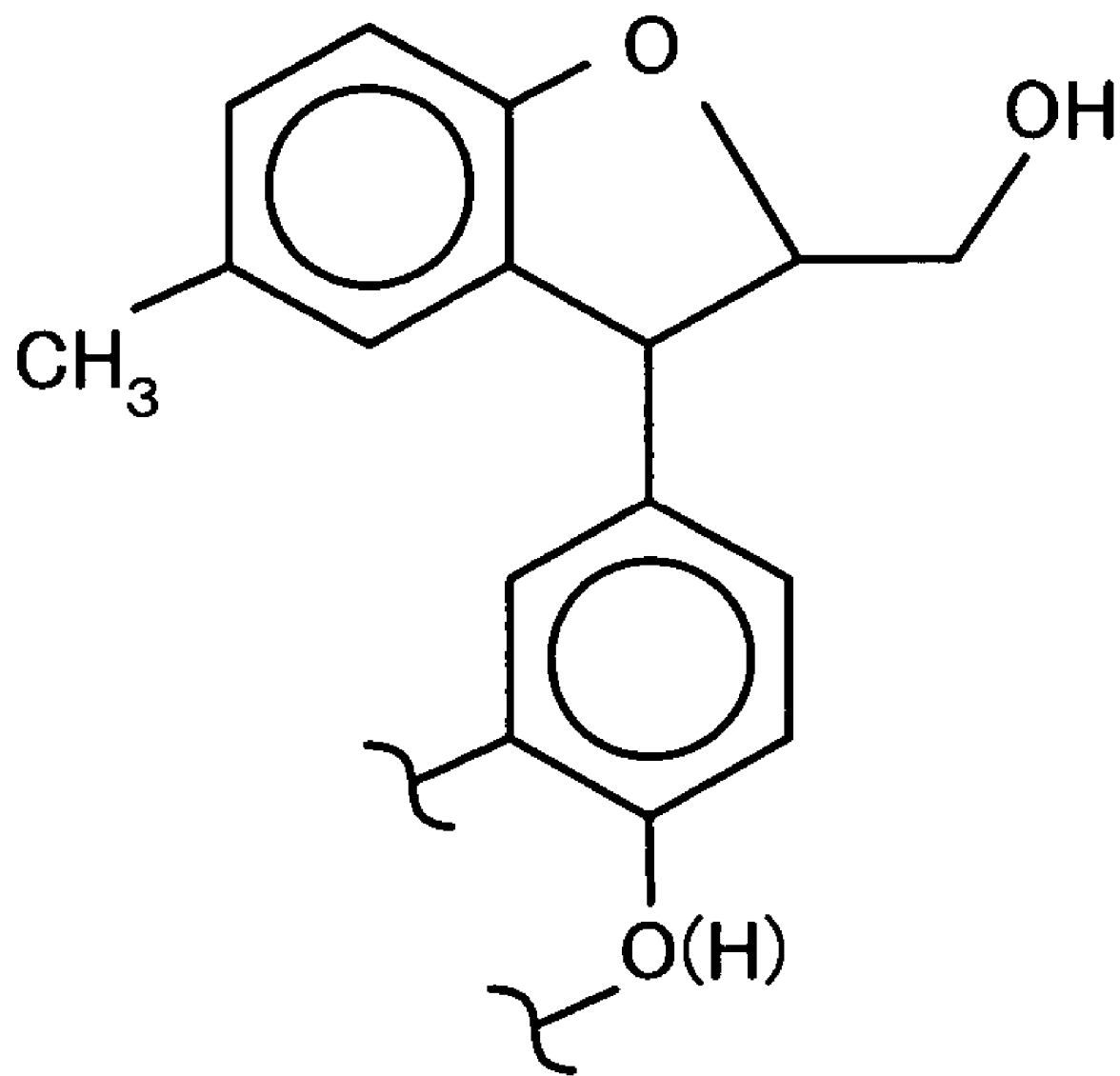
FIG. 4 shows an example of structural conversion by alkali treatment of a lignophenol derivative with the ortho-position binding unit.

The alkali treatment exposes the lignophenol derivative to an alkali, preferably under application of heat. In the alkali treatment of the lignophenol derivative with the ortho-position binding unit, which has a bond of the carbon atom at the ortho position relative to the phenol hydroxyl group in the grafted phenol compound to the carbon atom at the C1 position of the lignin structure, the phenoxide ion of the grafted phenol compound attacks the carbon atom at the C2 position of the lignin structure as shown in FIG. 4. The attack of the carbon atom at the C2 position cleaves the C2 aryl ether linkage. The gentle alkali treatment of the lignophenol derivative with the ortho-position binding unit cleaves the phenol hydroxyl group of the grafted phenol compound as shown in FIG. 4. The phenoxide ion thus produced attacks the C2 position of the C2 aryl ether linkage in an intramolecular nucleophilic manner to cleave the ether linkage to the lower-molecular lignophenol derivative.

The cleavage of the C2 aryl ether linkage produces the phenol hydroxyl group in the lignin structure (see the right dotted circle in FIG. 4). The intramolecular nucleophilic reaction causes the grafted phenol nucleus and the phenyl propane unit of the lignin structure to form the aryl coumaran unit.

This shifts the phenol hydroxyl group (see the left dotted circle in FIG. 4) of the phenol compound to the lignin structure (see the right dotted circle in FIG. 4). The resulting secondary derivative with this shift has different light absorbing characteristics from those of the original lignophenol derivative.

A procedure of the alkali treatment exposes the crosslinked lignophenol derivative to an alkali solution for a preset time period under application of heat when required. Any alkali solution having the function of dissociating the phenol hydroxyl group of the grafted phenol compound in the lignophenol derivative may be used for the alkali treatment. The alkali and the solvent used and the concentration of the alkali solution are not specifically restricted. Dissociation of the phenol hydroxyl group in the alkali environment forms the coumaran structure by the neighboring group participation. For example, a sodium hydroxide solution is applicable to the lignophenol derivative with graft of p-cresol. The alkali treatment may expose the lignophenol derivative to an alkali solution having the alkali concentration of 0.5 to 2 N for approximately 1 to 5 hours. Heating the alkali solution facilitates formation of the coumaran structure in the lignophenol derivative. The heating conditions including the temperature and the pressure are not specifically restricted. The alkali solution may be heated to or over 100° C., for example, 140° C., to degrade the crosslinked lignophenol derivative to the lower-molecular lignophenol derivative. Heating the alkali solution to or over its boiling point under pressure also degrades the crosslinked lignophenol derivative to the lower-molecular lignophenol derivative.

In the alkali treatment with a fixed alkali solution of a fixed concentration, the higher heating temperature in the temperature range of 120 to 140° C. accelerates the cleavage of the C2 aryl ether linkage to the lower-molecular lignophenol derivative. The higher heating temperature in this temperature range increases the phenol hydroxyl group derived from the aromatic nucleus of the lignin structure, while decreasing the phenol hydroxyl group derived from the grafted phenol compound. Regulation of the reaction temperature thus controls the degree of degradation to the lower-molecular lignophenol derivative and the degree of shift of the phenol hydroxyl group from the grafted phenol compound to the phenol nucleus of the lignin structure. The preferable reaction temperature range is 80 to 140° C. to accelerate the degradation to the lower-molecular lignophenol derivative and the formation of the aryl coumaran structure with the shift of the phenol hydroxyl group from the grafted phenol compound to the phenol nucleus of the lignin structure.

The cleavage of the C2 aryl ether linkage by the neighboring group participation of the C1 phenol nucleus in the ortho-position binding unit is accompanied with formation of the aryl coumaran structure as described above. The reaction temperature to degrade the crosslinked lignophenol derivative to the lower-molecular lignophenol derivative is, however, not restricted to the optimum temperature (approximately 140° C.) for efficient formation of the aryl coumaran structure. The reaction temperature may be set to a higher value, for example, approximately 170° C., according to the material and the application of the lignophenol derivative. This higher reaction temperature cleaves the coumaran ring to reproduce the phenol hydroxyl group in the grafted phenol compound, while newly forms conjugates by the change of the molecular structure with the shift of the aryl group. The resulting secondary derivative has different light absorbing characteristics from those of the original lignophenol derivative and those of the secondary derivative with the aryl coumaran structure.

The heating temperature of the alkali treatment is thus adequately settable in a range of 80 to 200° C., although these values are not restrictive. The temperature of extremely lower than 80° C. interferes with the smooth reaction, whereas the temperature of extremely higher than 200° C. accelerates the undesired side-reactions.

The preferable procedure of the alkali treatment for formation of the aryl coumaran structure and the accompanied degradation to the lower-molecular lignophenol derivative exposes the lignophenol derivative to, for example, a 0.5 N sodium hydroxide solution at 140° C. in an autoclave for 60 minutes. These conditions of the alkali treatment are especially preferable for the lignophenol derivative with graft of p-cresol or with graft of 2,4-dimethylphenol. The preferable procedure of the alkali treatment for formation of conjugates exposes the lignophenol derivative to, for example, a 0.5 N sodium hydroxide solution at 170° C. in an autoclave for 20 to 60 minutes.

(Higher-Order Derivative)

Any of the secondary derivatives obtained by the diversity of reactions described above may further go through any of these reactions (preferably different reactions from the first reaction) to produce a higher-order derivative.

The resulting higher-order derivative keeps the combined structural characteristics obtained by the selected reactions. For example, the higher-order derivative may be obtained by a combination of the alkali treatment with the introduction of the crosslinking group, by a combination of the alkali treatment with the hydroxyl group protecting reaction, such as the acylation, or by a combination of the introduction of the crosslinking group with the hydroxyl group protecting reaction, such as the acylation.

(Crosslinked Derivatives)

The secondary lignin prepolymer and the higher-order lignin prepolymer with the introduced crosslinking group may be thermally crosslinked to the crosslinked lignin derivatives. The lignin prepolymer supported on semiconductor particles or a semiconductor layer is thermally crosslinked to the crosslinked lignin derivative. The thermal crosslinking conditions are described later. The lignin prepolymers having the high linearity may have solubilities in some organic solvents. In such cases, the lignin derivative may be prepared as a photosensitizer solution to be absorbed in the semiconductor particles or in the semiconductor layer.

The diversity of lignin derivatives described above may be exposed to any of various energy irradiations, such as heat rays, light rays, and radiation rays. The energy irradiation accelerates polymerization of the lignin derivative to form conjugates and thereby expands the light absorption range and enhances the optical absorption intensity. The energy irradiation is not specifically restricted but is preferably one or a combination of various heat rays, light rays, radiation rays, and electron rays. The lignin derivative is exposed to the energy irradiation in the separation and extraction process or in the recycle process. The energy irradiation may not aim to increase the conjugates. Semiconductor particles with the lignin derivative supported thereon may independently be exposed to such energy irradiation, as described later.

(Semiconductor Thin Film Electrode, Photoelectric Transducer, and Photoelectrochemical Cell)

Figure 5:
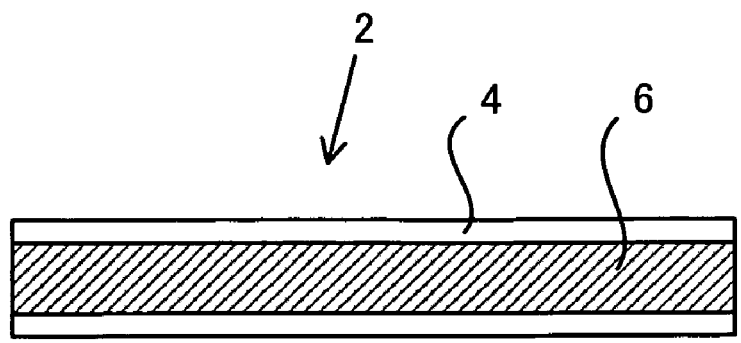
FIG. 5 shows the structure of a thin film electrode.
Figure 6:
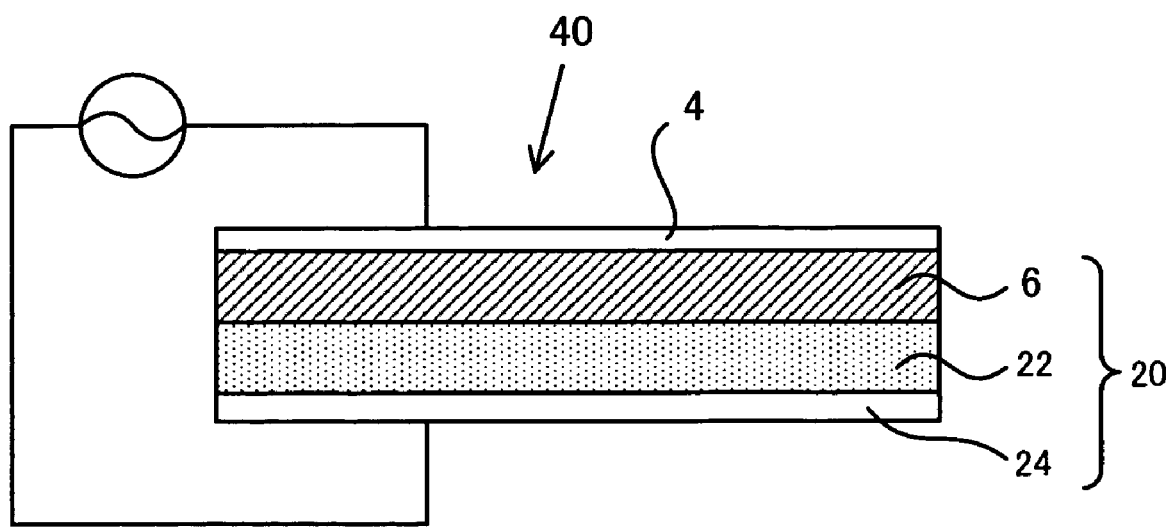
FIG. 6 shows the structure of a photoelectric transducer and a photoelectrochemical cell.

A semiconductor thin film electrode 2, a photoelectric transducer 20, and a photoelectrochemical cell 40 with application of any of the various lignin derivatives are described with reference to FIGS. 5 and 6. The semiconductor thin film electrode 2 includes a conductive support 4 and a semiconductor layer 6 formed thereon. The semiconductor layer 6 supports one or multiple lignin derivatives selected among the various lignin derivatives described above. The photoelectric transducer 20 has a charge transfer layer 22 and a counter electrode 24, in addition to the conductive support 4 and the semiconductor layer 6. In the specification hereof, a photoelectrochemical cell represents the photoelectric transducer applied in an external circuit to work as a cell. One example of the photoelectrochemical cell is a solar cell.

(Conductive Support)

The conductive support 4 may be composed of an electrically conductive material, such as metal, or may have a glass or plastic base and a conductive surface layer of a conductive agent. Examples of the conductive agent include metals (platinum, gold, silver, copper, aluminum, rhodium, and indium), carbon, and conductive metal oxides (indium-tin complex oxide and fluorine-doped tin oxide).

It is desirable that the conductive support 4 has substantial transparency, which is defined in the specification hereof by a light transmittance of not lower than 10%, preferably of not lower than 50%, or more preferably of not lower than 70%. The substantially transparent conductive support 4 is obtained, for example, by applying an electrically conductive metal oxide on a glass or plastic base.

(Semiconductor Layer)

The semiconductor layer 6 may have a single-layered structure or a multi-layered structure. The semiconductor of the semiconductor layer 6 may be any of single element semiconductors (for example, silicon and germanium), metal chalcogenides (for example, oxides, sulfides, and selenides) other compound semiconductors, and compounds of the perovskite structure. Preferable examples of the metal chalcogenide include oxides of titanium, tin, zinc, iron, tungsten, zirconium, hafnium, strontium, indium, cerium, yttrium, lanthanum, vanadium, niobium, and tantalum, sulfides of cadmium, zinc, lead, silver, antimony, and bismuth, selenides of cadmium and lead, and cadmium telluride. The other compound semiconductors include phosphides of zinc, gallium, indium, and cadmium, gallium arsenide, copper indium selenide, and copper indium sulfide.

The compounds of the perovskite structure include strontium titanate, calcium titanate, barium titanate, and potassium niobate.

Preferable examples of the semiconductor used in this invention are Si, $TiO_2$, $SnO_2$, $Fe_2O_3$, $WO_3$, ZnO, $Nb_2O_5$, CdS, PbS, CdSe, InP, GaAs, $CuInS_2$, and $CuInSe_2$. Among these examples, $TiO_2$ and $Nb_2O_5$ are specifically preferable and $TiO_2$ is most preferable.

The semiconductor of the invention may be single crystal or polycrystal and preferably has an average particle diameter of 0.01 to 0.06 μm, although these values are not restrictive. The semiconductor particles may be a combination of different distributions of particle diameter.

The semiconductor particles may be prepared by, for example, the known sol-gel method.

(Photosensitizer)

The photosensitizer may be only one lignin derivative or a combination of multiple lignin derivatives or may be a mixture of one or multiple lignin derivatives and another organic sensitizer. Photoelectrochemical cells are required to have desired light absorbing characteristics, for example, light absorbing characteristics suitable for solar rays, and a sufficiently wide wavelength range of photoelectric conversion. An adequate combination of multiple lignin derivatives with optionally another organic sensitizer is selected to widen the wavelength range of photoelectric conversion and to ensure the adequate light absorbing characteristics. For example, the ligno-p-cresol has a broad absorption to 700 nm with its peak at 437 nm.

The lignin derivatives are readily changeable to the secondary derivatives or to the crosslinked structures and are subject to the control of the photoelectric conversion characteristics and to the structural control for absorption or adsorption to the semiconductor or formation of the semiconductor layer.

Available examples of the organic sensitizer include methine dyes, such as phthalocyanine, porphyrin, cyanine, merocyanine, oxonol, and triphenylmethane, as well as xanthin, azo, and anthraquinone dyes and ruthenium complexes and other metal complexes.

A composite material of the lignin derivative as the photosensitizer and an inorganic material or an organic material may be applied on the semiconductor layer 6 or the semiconductor particles. The inorganic or organic material may otherwise be mixed with the lignin derivative to form the composite material in the semiconductor layer 6. The inorganic material may be one of ceramics, glasses, and metals, and the organic material may be one of celluloses and various resins.

Application of the composite material of the lignin derivative and the inorganic or organic material facilitates formation of the semiconductor layer 6 with the lignin derivative stably retained and fixed and homogeneously dispersed.

(Production of Electrode)

The photosensitized semiconductor layer 6 may be formed by applying the photosensitizer-supported semiconductor particles on one face of the conductive support 4 or by making the photosensitizer supported on the semiconductor layer 6 formed on the conductive support 4.

One method adoptable to support the photosensitizer on the semiconductor particles or on the semiconductor layer 6 soaks the dried semiconductor particles or the semiconductor layer 6 formed on the conductive support 4 with a solution of the photosensitizer. The solution of the photosensitizer may be heated to, for example, a temperature range of 50 to 100° C. according to the requirements.

Any solvent that is capable of dissolving a selected lignin derivative, that is, one or a combination of the lignophenol derivatives, the secondary derivatives, and the higher-order derivatives, is used to prepare the solution of the photosensitizer. Examples of this solvent include methanol, ethanol, acetone, dioxane, pyridine, tetrahydrofuran, dimethylformamide, aqueous alkali solutions, mixtures thereof, and aqueous mixtures thereof.

The preferable solvent for the lignin derivative of the invention is one or a mixture selected among acetone, pyridine, methanol, and tetrahydrofuran. The especially preferable solvent is methanol.

The semiconductor particles or the semiconductor layer 6 may be soaked sufficiently with a solution of the crosslinking secondary derivative or the crosslinking high-order derivative. The crosslinking derivative is then thermally crosslinked to the crosslinked derivative, which functions as the photosensitizer.

Figure 7:
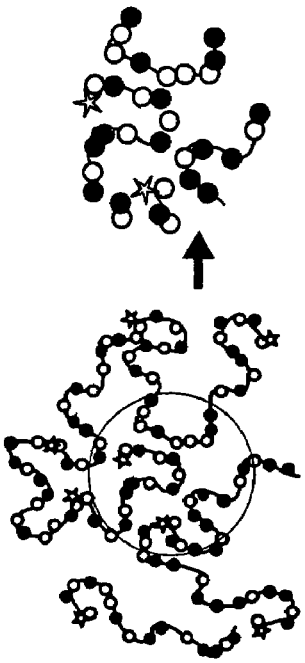
FIG. 7 shows various crosslinking structures by application of different phenol compounds to give lignophenol derivatives.
Figure 7:
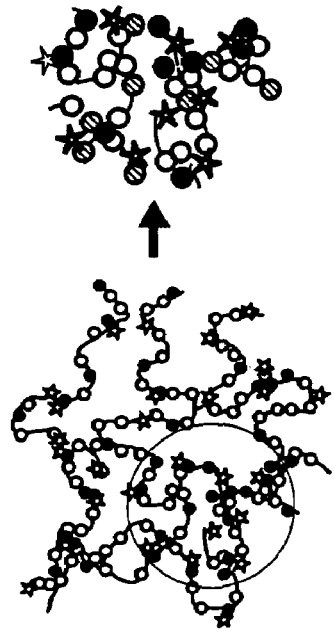
Figure 7:
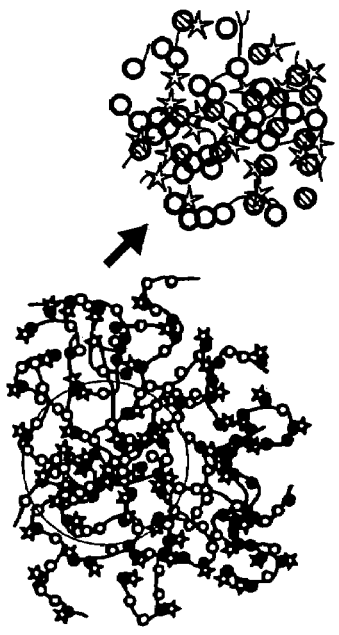

The thermal crosslinking conditions are not specifically restricted but are set adequately to ensure the smooth crosslinking reaction. One available thermal crosslinking process raises the temperature to approximately 150 to 180° C. at a rate of 1 to 2° C./minute and then lowers the temperature. Another available process raises the temperature to a preset maximum level, keeps the temperature at the preset maximum level for one hour, and then lowers the temperature. FIG. 7 shows resulting crosslinked structures.

The crosslinked structure depends upon the sites and the number of substituents in the grafted phenol nucleus as mentioned previously. The left drawing of FIG. 7 shows a prepolymer obtained by methylolation of the lignophenol derivative with a monosubstituted phenol (p-cresol) and a resulting polymer of the network structure obtained by thermally crosslinking the prepolymer. This prepolymer has the crosslinking group introduced over the whole molecular chain.

The right drawing of FIG. 7 shows a prepolymer obtained by methylolation of the lignophenol derivative with a disubstituted phenol (2,4-dimethylphenol) and a resulting polymer of the linear structure obtained by thermally crosslinking the prepolymer. This prepolymer has the crosslinking group mainly at polymer ends.

The center drawing of FIG. 7 shows a prepolymer obtained by introduction of the crosslinking group to the lignophenol derivative grafted with both the monosubstituted phenol and the disubstituted phenol (p-cresol and 2,4-dimethylphenol) and a resulting polymer mixture of the linear structure and the network structure.

A selected lignin derivative (preferably one of the lignophenol derivatives and the secondary and higher-order derivatives without the crosslinking group) may be reacted with a polymerizing agent, for example, a diisocyanate, a phenol resin material, or epichlorohydrin, to form the crosslinked structure of the lignin derivative in the semiconductor layer 6 or in the semiconductor particles. This gives the function of photoelectric conversion to the semiconductor layer 6.

The semiconductor layer 6 may contain an organic compound derived from the wood resource or its derivative, in addition to the lignin derivative of the invention. The organic compound or its derivative may be a cellulose material, a polyphenol material, or another lignin material that is soluble in the solvent selected for the solution of the photosensitizer. The cellulose material has the shape-keeping power of semiconductor films. The polyphenol material produced as a by-product in the manufacturing process of the lignophenol derivative or another lignin derivative has the photosensitizing ability and may be used in combination with the lignin derivative of the invention. The polyphenol material is, for example, the concentrate of a defatted acetone solution of the wood material heated at 140° C. (wood extract). Any of natural lignins and industrially manufactured lignins by steam blasting treatment that are soluble in the solvent selected for the solution of the photosensitizer may also be used as an additional photosensitizer.

Any of diverse known techniques may be adopted to apply the semiconductor particles with or without adsorption of the photosensitizer on the surface of the conductive support 4 and form the semiconductor layer 6. One technique coats the conductive support 4 with a dispersion or a colloidal solution of the semiconductor particles. Available techniques include coating method, sol-gel method, soaking method, roller method, dipping method, air knife method, extrusion method, slide hopper method, wire bar method, spinning method, spraying method, casting method, and various printing methods. The wet techniques, such as the coating method, the soaking method, and the printing methods are preferable. The semiconductor layer 6 preferably goes through heat treatment in a temperature range of 40 to 700° C. for the enhanced adhesiveness to the conductive support 4. The photosensitizer is preferably absorbed or adsorbed to the semiconductor layer 6 after the heat treatment (more specifically immediately after the heat treatment). Another preferable method simultaneously applies the semiconductor particles and the photosensitizer on the conductive support 4 to form the photosensitized semiconductor layer 6.

The dispersion of the semiconductor particles may be prepared by the sol-gel method or by crushing the semiconductor particles with a mortar or a mill. The dispersion medium may be water or a selected one of various organic solvents, such as methanol, ethanol, acetone, and acetonitrile.

The resulting photosensitized semiconductor layer 6 contains the lignin derivative tightly bonded to the semiconductor particles because of the inherent caking power of the lignin derivative. The crosslinked lignin derivative gives the semiconductor layer 6 of the higher strength and the higher adhesiveness.

(Photoelectric Transducer and Photoelectrochemical Cell)

The photoelectric transducer 20 and the photoelectrochemical cell 40 are structured to include the charge transfer layer 22 and the counter electrode 24, in addition to the semiconductor thin film electrode 2 having the conductive support 4 and the semiconductor layer 6.

(Charge Transfer Layer)

The charge transfer layer 22 is typically an electrolytic solution of redox pairs dissolved in an organic solvent, a gel electrolyte of a polymer matrix soaked with redox pairs dissolved in an organic solvent or a molten salt containing redox pairs. Other available examples include solid electrolytes and hole transport materials.

The electrolytic solution of the invention preferably contains a combination of iodine ($I_2$) and an iodide or a combination of bromine ($Br_2$) and a bromide as the electrolyte. Examples of the iodide include metal iodides like LiI, NaI, KI, CsI, and $CaI_2$ and tert-ammonium iodides like tetraslkylammonium iodide, pyridinium iodide, and imidazolium iodide. Examples of the bromide include metal bromides like LiBr, NaBr, KBr, CsBr, and $CaBr_2$ and tert-ammonium bromides like tetraalkylammonium bromide and pyridinium bromide. Other available electrolytes include metal complexes like ferrocyanide-ferricyanide and ferrocene-ferricinium, sulfur compounds like sodium polysulfide and alkyl thiol-alkyl disulfide, viologen dye, and hydroquinone-quinone. Especially preferable are a combination of iodine and potassium iodide and a combination of iodine and lithium iodide.

The solvent used for the electrolytic solution of the invention may be any of carbonates like ethylene carbonate and propylene carbonate, heterocyclic compounds like 3-methyl-2-oxazolidinone, ethers like dioxane, diethyl ether, ethylene glycol dialkyl ethers, propylene glycol dialkyl ethers, polyethylene glycol dialkyl ethers, and polypropylene glycol dialkyl ethers, alcohols like methanol, ethanol, ethylene glycol monoalkyl ethers, propylene glycol monoalkyl ethers, polyethylene glycol monoalkyl ethers, and polypropylene glycol monoalkyl ethers, polyalcohols like ethylene glycol, propylene glycol, polyethylene glycol, polypropylene glycol, and glycerol, nitriles like acetonitrile, glutarodinitrile, methoxyacetonitrile, propionitrile, and benzonitrile, aprotic polar compounds like dimethylsulfoxide (DMSO) and sulfolane, and water. Especially preferable is acetonitrile.

The electrolyte may be gelated by addition of a polymer or an oil gelling agent, by polymerization with a multifunctional monomer, or by a crosslinking reaction. The electrolyte may be replaced by an inorganic hole transport material, an organic hole transport material or their combination.

One method of forming the charge transfer layer 22 inserts the charge transfer layer 22 of the liquid electrolyte between a gap between the counter electrode 24 and the photosensitizer-supported semiconductor layer 6. Another method applies the charge transfer layer 22 directly on the semiconductor layer 6 and subsequently forms the counter electrode 24 on the charge transfer layer 22.

In the former method, applicable techniques for insertion of the charge transfer layer 22 include an atmospheric process that utilizes capillarity of, for example, immersion and a vacuum process that replaces a gas phase with a liquid phase under a reduced pressure. In the latter method, the counter electrode 24 is formed on the wet charge transfer layer 22 to prevent leakage of the charge transfer layer 22 from its edges. The charge transfer layer 22 of the gel electrolyte may be polymerized and dried, prior to formation of the counter electrode 24. Like formation of the semiconductor layer 6, various wet techniques may be adopted to form the charge transfer layer 22 of an electrolytic solution, a gel electrolyte, or a wet organic hole transport material. Available techniques soaking method, roller method, dipping method, air knife method, extrusion method, slide hopper method, wire bar method, spinning method, spraying method, casting method, and various printing methods. The charge transfer layer 22 of a solid electrolyte or a solid hole transport material may be formed by a dry deposition technique, such as vacuum deposition or CVD, prior to formation of the counter electrode 24.

(Counter Electrode)

The counter electrode 24 included in the photoelectric transducer 20 works as a cathode of the photoelectrochemical cell 40. The counter electrode 24 may include a support body with a conductive layer, like the conductive support 4 of the semiconductor thin film electrode 2. The structure of the counter electrode 24 having high strength and sufficient seal performance, however, does not require the support body. Examples of the conductive material of the counter electrode 24 include metals (platinum, gold, silver, copper, aluminum, rhodium, indium, and palladium), carbon, and conductive metal oxides (indium-tin complex oxide and fluorine-doped tin oxide) Especially preferable is platinum element or a platinum-containing alloy (for example, Au—Pd). The counter electrode 24 preferably has a thickness of 2 nm to 20 µm, although these values are not restrictive.

At least one of the conductive support 4 and the counter electrode 24 should be substantially transparent to enable transmission of the light rays to the semiconductor layer 6. In one preferable structure of the photoelectric transducer 20 and the photoelectrochemical cell 40, the solar rays are entered from the transparent conductive support 4, while the counter electrode 24 has the light reflecting ability. The counter electrode 24 may be a glass, plastic, or metal thin film with a metal or a conductive oxide deposited thereon.

Like the formation of the charge transfer layer 22, the counter electrode 24 may be formed on the charge transfer layer 22 or on the semiconductor layer 6. In either case, the conductive material is applied, laminated, deposited, or pasted on either of the charge transfer layer 22 or the semiconductor layer 6 to form the counter electrode 24. For example, the support body with the conductive layer of the conductive material applied or deposited (for example, by CVD) is bonded to the charge transfer layer 22 or to the semiconductor layer 6. The conductive material may be applied, plated, or deposited (for example, by PVD or by CVD) directly on the solid charge transfer layer 22 to form the counter electrode 24.

The lignin derivatives used as the photosensitizer of the photoelectric transducer 20 and the photoelectrochemical cell 40 have the photoelectric conversion power and are derived from the wood resource. The photoelectric transducer 20 and the photoelectrochemical cell 40 of the invention can thus supply electric power without consuming the fossil resource. The lignophenol derivatives, the secondary derivatives, the higher-order derivatives, and the crosslinked derivatives of the invention are all polymers and have caking power to be well combined with the semiconductor particles or with the semiconductor layer and attain the stable and efficient photoelectric conversion. The lignophenol derivatives, the secondary derivatives, and some of the higher-order derivatives are polymers but are still soluble in some organic solvents. Such solubility facilitates preparation of the photosensitizer, as well as enhances recycle of at least either of the lignin derivative and the semiconductor material. The lignin derivative (lignophenol derivative, secondary derivative, or higher-order derivative) is readily separated from the semiconductor material by simply soaking the used photoelectric transducer 20 and the photoelectrochemical cell 40 in a selected organic solvent. The crosslinked derivative having the high linearity (for example, the crosslinked secondary derivative obtained from the lignophenol derivative with 2,4-dimethyl phenol or another 2,4-substituted phenol compound) is soluble in an organic solvent THF and is thus readily recycled.

The higher-molecular lignin derivatives including the crosslinked derivatives having the ortho-position binding unit are readily degraded to the lower-molecular lignin derivatives by alkali treatment. The alkali treatment as one of the derivation reactions is adopted to separate the lignin derivative from the semiconductor layer 6 or from the photoelectric transducer 20. The alkali treatment changes the structure of the lower-molecular lignin derivative simultaneously with the separation from the semiconductor layer 6.

The semiconductor layer 6 or the photoelectric transducer 20 is preferably crushed to small pieces or crude particles, prior to the alkali treatment for separation the lignin derivative from the semiconductor layer 6. The conditions of the alkali treatment are adequately selected for degradation of the composite material. The alkali treatment heats an alkali solution, for example, 0.1 to 0.5 N NaOH, to or over 100° C. or preferably to approximately 140° C. to degrade the higher-molecular lignin derivative to the lower-molecular lignin derivative. The alkali solution may otherwise be heated to or over its boiling point under pressure. The heating condition of the gentle alkali treatment is in a range of about 80° C. to 150° C., while the heating condition of the severe alkali treatment is in a range of about 150 to 170° C.

The alkali treatment degrades the higher-molecular lignin derivatives to the lower-molecular lignin derivatives and forms new partial structures and phenol hydroxyl group to enhance the degree of freedom for further derivation.

The lignin derivative is subject to various structural changes as well as separation and release from the semiconductor layer and is thus readily controlled to have the adequate structure and composition for the desired photoelectric conversion property and the adsorption or absorption characteristics to the semiconductor layer. The lignin derivative of the wood resource may be first used as the photoelectric transducer and subsequently used for another application with or without the structural change. On the contrary, the lignin derivative may be first used for another application and subsequently used as the photoelectric transducer with or without the structural change.

EXAMPLES

Some examples of the present invention are described below, although these examples are only illustrative and not restrictive in any sense.

Example 1

Preparation of Lignophenol Derivative

After addition of 3.0 ml of an acetone solution containing 3.0 g of p-cresol to 3.0 g of acetone-defatted, dried Douglas fir powder with stirring, the mixture was sealed and stood overnight. The wood powder with adsorbed p-cresol was obtained by stirring the mixture with a glass bar for removal of acetone. The preparation process then added 3.0 ml of 72% sulfuric acid to the total volume of the p-cresol-adsorbed wood powder, swiftly stirred the mixture with a glass bar to lower the viscosity of the mixture, and magnetically stirred the mixture for one hour in the atmosphere at room temperature. The mixture was then added to 300 ml of ion-exchange water with stirring and was subject to centrifugal separation for removal of the acid content to pH 5 through 6. The sediment was freeze-dried overnight, was added to 300 ml of acetone, and was sealed and magnetically stirred overnight in the atmosphere at room temperature. The reaction solution was again centrifuged. The dark brown supernatant was collected, was concentrated to 80 ml, and was added in drops to 300 ml of diethyl ether stored in ice. The obtained white purple sediment was collected by centrifugation. Removal of ether from the sediment gave Douglas fir-derived ligno-p-cresol as the lignophenol derivative of the invention with p-cresol.

Example 2

Production of Photoelectrochemical Cell

A photosensitizer solution was prepared by dissolving 10 mg of the ligno-p-cresol obtained in Example 1 in 20 ml of acetone. An FTO glass plate coated with a titanium oxide thin film over an area of 30 mm×20 mm was soaked in the photosensitizer solution overnight. After drying the photosensitized FTO glass plate, the production process applied 3 drops of an $I_2$/KI solution onto the titanium oxide thin film coat of the dried photosensitized FTO glass plate. The photosensitized FTO glass plate was then placed and fixed between a pair of FTO glass plates with carbon deposited thereon at 60 KeV. This completed a photoelectrochemical cell (solar cell)

Example 3

Performance Evaluation

The solar cell produced in Example 2 was exposed to solar rays, 20 WFL fluorescent light, and 20 WHL incandescent light and was evaluated for the photoelectromotive force and the photoelectric current. The results of evaluation are shown in Table 2:

TABLE 2

| Exposure Condition | Photoelectromotive Force V (mV) | Photoelectric Current I (μA/cm²) |
|---|---|---|
| Solar Rays (Direct Sunlight) | 356 | 84.7 |
| Solar Rays (Shade) | 324 | 22.7 |
| Fluorescent Light (Distance: 10 mm) | 182 | 2.7 |
| Incandescent Light (Distance: 10 mm) | 202 | 2.7 |

The results of evaluation in Table 2 prove the sufficient electric power supply from the solar cell produced in Example 2.

Example 4

A photosensitizer solution was prepared by dissolving 10 mg of the ligno-p-cresol obtained in Example 1 in 20 ml of acetone. An FTO glass plate coated with a titanium oxide thin film over an area of 30 mm×20 mm was soaked in the photosensitizer solution overnight. After drying the photosensitized FTO glass plate, the production process applied 9 drops of a LiI/$I_2$/propylene carbonate solution (0.5 M KI, 0.05 M $I_2$) onto the titanium oxide thin film coat of the dried photosensitized FTO glass plate. The photosensitized FTO glass plate was then placed and fixed between a pair of FTO glass plates with Au/Pd (60-40) alloy deposited thereon. This completed a photoelectrochemical cell (solar cell) Another photoelectrochemical cell was produced in a similar manner with replacement of the photosensitizer solution of the ligno-p-cresol of Example 1 by the concentrate (polyphenol-containing wood extract) obtained by heating an acetone solution of defatted wood powder at 140° C.

These photoelectrochemical cells were exposed to direct sunlight and were evaluated for the photoelectromotive force and the photoelectric current. The results of evaluation are shown in Table 3:

TABLE 3

| Sample | Photoelectromotive Force V (mV) | Photoelectric Current I (μA/cm²) |
|---|---|---|
| Douglas fir-derived lingo-p-cresol | 517 | 218.2 |
| Concentrate by heating acetone solution of defatted wood powder at 140° C.– | 487 | 148.1 |

Example 5

Lignophenol derivatives were prepared from dried Japanese cypress powder and phenol, catechol, resorcinol, and pyrogallol as the phenol compound in a similar manner as Example 1. Photosensitizer solutions were prepared by dissolving 10 mg of the respective lignophenol derivatives in 20 ml of acetone. Each photosensitizer solution was applied in drops onto an ITO glass plate coated with a titanium oxide thin film over an area of 40 mm×20 mm and was immediately dried. The production process applied 25 μl of a LiI/$I_2$/propylene carbonate solution (0.5 M KI, 0.05 M $I_2$) in drop onto the titanium oxide thin film coat of the dried photosensitized ITO glass plate. The photosensitized ITO glass plate was then placed and fixed between a pair of ITO glass plates with Au/Pd (60-40) alloy deposited thereon. This completed each photoelectrochemical cell (solar cell).

The respective photoelectrochemical cells were exposed to direct sunlight and were evaluated for the photoelectromotive force and the photoelectric current. The results of evaluation are shown in Table 4:

TABLE 4

| Sample | Photoelectromotive Force V (mV) | Photoelectric Current I (μA/cm²) |
|---|---|---|
| Japanese cypress-derived lignophenol | 490 | 96.0 |
| Japanese cypress-derived lignocatechol | 373 | 84.4 |
| Japanese cypress-derived lignoresorcinol | 309 | 68.1 |
| Japanese cypress-derived lignopyroggalol | 392 | 100.4 |

Example 6

Lignophenol derivatives were prepared from dried Japanese cypress powder and phenol and from dried Douglas fir powder and p-cresol in a similar manner as Example 1. Photosensitizer solutions were prepared by dissolving 10 mg of the respective lignophenol derivatives in 20 ml of methanol. An ITO glass plate coated with a titanium oxide thin film over an area of 6.0 mm×8.0 mm was soaked in each photosensitizer solution for 3 hours and was dried. The production process applied 25 μl of a LiI/I$_2$/acetonitrile solution (0.5 M LiI, 0.05 M I$_2$) in drops onto the titanium oxide thin film coat of the dried photosensitized ITO glass plate. The photosensitized ITO glass plate was then placed and fixed between a pair of Pt-deposited ITO glass plates. This completed each photoelectrochemical cell (solar cell).

The respective photoelectrochemical cells were exposed to radiation of a 150 W xenon lamp and were evaluated for the photoelectromotive force and the photoelectric current. The results of evaluation are shown in Table 5:

TABLE 5

| Sample | Photoelectromotive Force V (mV) | Photoelectric Current I (μA/cm²) |
|---|---|---|
| Japanese cypress-derived lignophenol | 480 | 9.49 |
| Douglas fir-derived ligno-p-cresol | 530 | 11.50 |

What is claimed is:

1. A photoelectric energy conversion element comprising:
   a semiconductor film electrode having a semiconductor layer comprising a semiconductor material and one or more lignin derivatives which absorb light and photosensitize said semiconductor material; the lignin derivatives selected from the group consisting of (a) through (e):
   (a) a lignophenol derivative or a phenol derivative of lignin that is prepared by solvating a lignin-containing material with a phenol compound and adding an acid to the solvate;
   (b) a secondary derivative that is prepared by one reaction of the lignophenol derivative (a) selected from the group consisting of acylation, carboxylation, amidation, introduction of a crosslinking group, and alkali treatment;
   (c) a higher-order derivative that is prepared by at least two reactions of the lignophenol derivative (a) selected from the group consisting of acylation, carboxylation, amidation, introduction of a crosslinking group, and alkali treatment;
   (d) a crosslinked secondary derivative that is prepared by crosslinking the secondary derivative (b) obtained by the introduction of the crosslinking group;
   (e) a crosslinked higher-order derivative that is prepared by crosslinking the higher-order derivative (c) obtained by the introduction of the crosslinking group;
   a charge transfer layer; and
   a counter electrode.

2. A photoelectric energy conversion element in accordance with claim 1, wherein the semiconductor film electrode comprises the lignophenol derivative (a).

3. A photoelectric energy conversion element in accordance with claim 1, wherein the phenol compound is one or a combination selected from the group consisting of p-cresol, 2,6-dimethylphenol, 2,4-dimethylphenol, 2-methoxyphenol, 2,6-dimethoxyphenol, catechol, resorcinol, 4-methylcatechol, pyrogallol, and phloroglucinol.

4. A photoelectric energy conversion element in accordance with claim 1, wherein the phenol compound is p-cresol.

5. A photoelectric energy conversion element in accordance with claim 1, wherein the lignophenol derivative has at least either of an ortho-bonded 1,1-bis(aryl) propane unit having a bond between a carbon atom at a C1 position of an aryl propane unit of lignin and a carbon atom at an ortho position relative to a phenol hydroxyl group of the phenol compound and a para-bonded 1,1-bis(aryl) propane unit having a bond between the carbon atom at the C1 position and a carbon atom at a para position relative to the phenol hydroxyl group.

6. A photoelectric energy conversion element in accordance with claim 1, wherein the semiconductor film electrode further comprises one or more materials selected from the group consisting of cellulose materials, ceramic materials, metal materials, and glass materials.

7. A photoelectric energy conversion element in accordance with claim 1, wherein the lignin derivative is exposed to one or multiple energy irradiations selected from the group consisting of heat, light, and radiation.

8. A photoelectric energy conversion element in accordance with claim 1, wherein the semiconductor film electrode further comprises a lignocellulose-derived organic material containing cellulose, lignin, and polyphenol materials or a derivative of the organic material.

9. A photo electrochemical cell which comprises a photoelectric energy conversion element in accordance with claim 1.

10. A photoelectrochemical cell in accordance with claim 9, wherein said cell is solar cell.

11. A manufacturing method of a photoelectric energy conversion element, comprising:
   preparing a semiconductor film electrode with a semiconductor material and one or more lignin derivatives selected from the group consisting of (a) through (e);
   (a) lignophenol derivative or a phenol derivative of lignin that is prepared by solvating a lignin-containing material with a phenol compound and adding an acid to the solvate;
   (b) a secondary derivative that is prepared by one reaction of the lignophenol derivative (a) selected from the group consisting of acylation, carboxylation, amidation, introduction of a crosslinking group, and alkali treatment;
   (c) a higher-order derivative that is prepared by at least two reactions of the lignophenol derivative (a) selected from the group consisting of acylation, carboxylation, amidation, introduction of a crosslinking group, and alkali treatment;
(d) a crosslinked secondary derivative that is prepared by crosslinking the secondary derivative (b) obtained by the introduction of the crosslinking group;
(e) a crosslinked higher-order derivative that is prepared by crosslinking the higher-order derivative (c) obtained by the introduction of the crosslinking group; and constructing said photoelectric energy conversion element having said semiconductor film electrode, a charge transfer layer and a counter electrode.

12. A method of generating electronic power, comprising:
preparing a photoelectrochemical cell comprising a semiconductor film electrode having a semiconductor layer comprising a semiconductor material and one or more lignin derivatives which absorb light and photosensitize said semiconductor material, the lignin derivatives selected from the group consisting of (a) through (e):
(a) a lignophenol derivative or a phenol derivative of lignin that is prepared by solvating a lignin-containing material with a phenol compound and adding an acid to the solvate;
(b) a secondary derivative that is prepared by one reaction of the lignophenol derivative (a) selected from the group consisting of acylation, carboxylation, amidation, introduction of a crosslinking group, and alkali treatment;
(c) a higher-order derivative that is prepared by at least two reactions of the lignophenol derivative (a) selected from the group consisting of acylation, carboxylation, amidation, introduction of a crosslinking group, and alkali treatment;
(d) a crosslinked secondary derivative that is prepared by crosslinking the secondary derivative (b) obtained by the introduction of the crosslinking group;
(e) a crosslinked higher-order derivative that is prepared by crosslinking the higher-order derivative (c) obtained by the introduction of the crosslinking group;

a charge transfer layer, and a counter electrode; and
said lignin irradiating derivatives in said semiconductor material to generate electric power.

* * * * *